United States Patent [19]
Frenkil

[11] Patent Number: 5,181,203
[45] Date of Patent: Jan. 19, 1993

[54] TESTABLE POWER-ON-RESET CIRCUIT

[75] Inventor: Gerald L. Frenkil, Brookline, Mass.

[73] Assignee: VLSI Technology, Inc., San Jose, Calif.

[21] Appl. No.: 631,544

[22] Filed: Dec. 21, 1990

[51] Int. Cl.⁵ ............................................ G01R 31/28
[52] U.S. Cl. ................................. 371/15.1; 307/272.3
[58] Field of Search ......................... 371/15.1, 16.1; 307/272.3; 364/280.2

[56] References Cited

U.S. PATENT DOCUMENTS

| | | | |
|---|---|---|---|
| 4,433,390 | 2/1984 | Carp et al. | 364/900 |
| 4,888,498 | 12/1989 | Kadakia | 307/272.3 |
| 4,904,883 | 2/1990 | Iino et al. | 307/272.3 |
| 5,051,611 | 9/1991 | Kantz | 307/272.3 |
| 5,109,163 | 4/1992 | Benhamida | 307/272.3 |

*Primary Examiner*—Charles E. Atkinson
*Attorney, Agent, or Firm*—Douglas L. Weller

[57] ABSTRACT

A testable power-on-reset circuit allows the reset of an electronic device without de-coupling a power signal from the electronic device. The testable power-on-reset circuit includes reset circuitry, a buffer and a buffer controller. The reset circuitry includes a reset power line on which is placed a reset power signal. The reset circuitry also includes a reset output upon which the reset circuitry places a first reset signal value responsive to the reset circuitry initially detecting the reset power signal on the reset power line and upon which the reset circuitry places a second reset signal value responsive to a period of time passing from the reset circuitry initially detecting the reset power signal on the reset power line. When it is desired to test the reset of the electronic device, the buffer controller, in response to a predetermined condition, causes the buffer to remove the reset power signal from the reset power line of the reset circuitry. The reset circuitry, in response to the removal of the reset power signal from the reset power line, removes the second reset signal value from the reset output. When the predetermined condition is removed, the buffer control causes the buffer to restore the reset power signal to the reset power line. Then, the electronic device performs a reset in response to the first reset signal value being placed on the reset output and completes the reset when the second reset signal value is placed on the reset output.

13 Claims, 3 Drawing Sheets

TESTABLE POWER-ON-RESET CIRCUIT

BACKGROUND

The present invention concerns a testable power-on-reset circuit which allows for the test of reset features of an electronic device without the requirement that power be removed from the electronic device.

In many electronic devices, a power-on-reset circuit is included. The power-on-reset circuit detects when the electronic device on which the power-on-reset circuit resides is powered up. Once the power-on-reset circuit detects power up of the electronic device, the power-on-reset circuit holds its output low for a period of time sufficient for the entire electronic device to receive full power-up. While the power-on-reset circuit holds its output low, the electronic device performs a reset. After the entire electronic device has received full power up, the power-on-reset raises its output high, at which time the electronic device completes the reset sequence.

Electronic devices are typically tested using automatic test equipment (ATE). Often times it is desirable for an ATE to loop through a number of test vectors, each of the test vectors beginning with a reset of the electronic device. Such vector looping is an important debugging and characterization procedure which is performed with power constantly applied to the electronic device under test. Unfortunately, use of a conventional power-on-reset circuit does not allow such vector looping because an electronic device including a conventional power-on-reset circuit does not issue a reset without the removing and then re-applying of power to the electronic device.

SUMMARY OF THE INVENTION

In accordance with the preferred embodiment of the present invention, a testable power-on-reset circuit is presented. The testable power-on-reset circuit allows the reset of an electronic device without de-coupling a power signal from the electronic device. The testable power-on-reset circuit includes reset circuitry, a buffer and a buffer controller.

The reset circuitry, e.g., a conventional power-on-reset circuit, includes a reset power line on which is placed a reset power signal. The reset circuitry also includes a reset output upon which the reset circuitry places a first reset signal value responsive to the reset circuitry initially detecting the reset power signal on the reset power line and upon which the reset circuitry places a second reset signal value responsive to a period of time passing from the reset circuitry initially detecting the reset power signal on the reset power line.

When it is desired to test the reset of the electronic device, the buffer controller, in response to a predetermined condition, causes the buffer to remove the reset power signal from the reset power line of the reset circuitry. The reset circuitry, in response to the removal of the reset power signal from the reset power line, removes the second reset signal value from the reset output. When the predetermined condition is removed, the buffer control causes the buffer to restore the reset power signal to the reset power line. Then, the electronic device performs a reset in response to the first reset signal value being placed on the reset output and completes the reset when the second reset signal value is placed on the reset output.

The buffer controller may be, for example, a decoder which, in response to an illegal input condition on inputs of the electronic device, causes the buffer to remove the reset power signal from the reset power line. A glitch filter may be added between the buffer and the buffer controller to prevent electrical noise from generating a reset.

DESCRIPTION OF THE PRIOR ART

Figure 1:
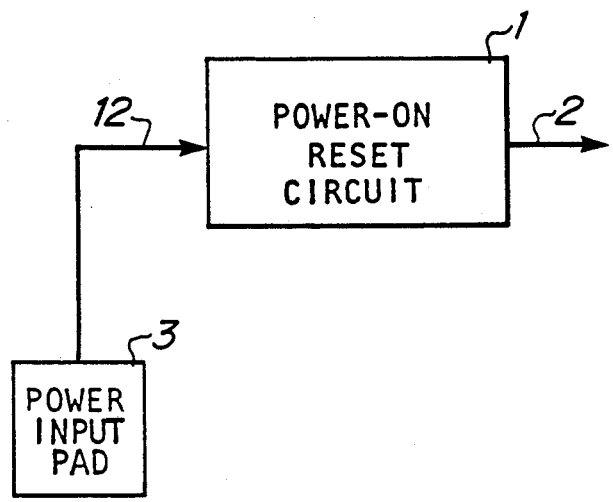
FIGS. 1 and 2 show a prior art implementation of a power-on-reset circuit.

FIG. 1 shows a block diagram of a conventional power-on-reset circuit 1. A power signal being placed on a power input pad 3 of an electronic device on which power-on-reset circuit 1 resides is forwarded to a reset power line 12 of power-on-reset circuit 1 Once the power signal is detected on reset power line 12, power-on-reset circuit 1 retains a reset output 2 low for a period of time sufficient for the entire electronic device to receive full power-up. While power-on-reset circuit 1 retains reset output 2 low, the electronic device performs a reset. After the entire electronic device has full power-up, power-on-reset 1 raises high reset output 2, at which time the electronic device completes the reset sequence.

Figure 2:
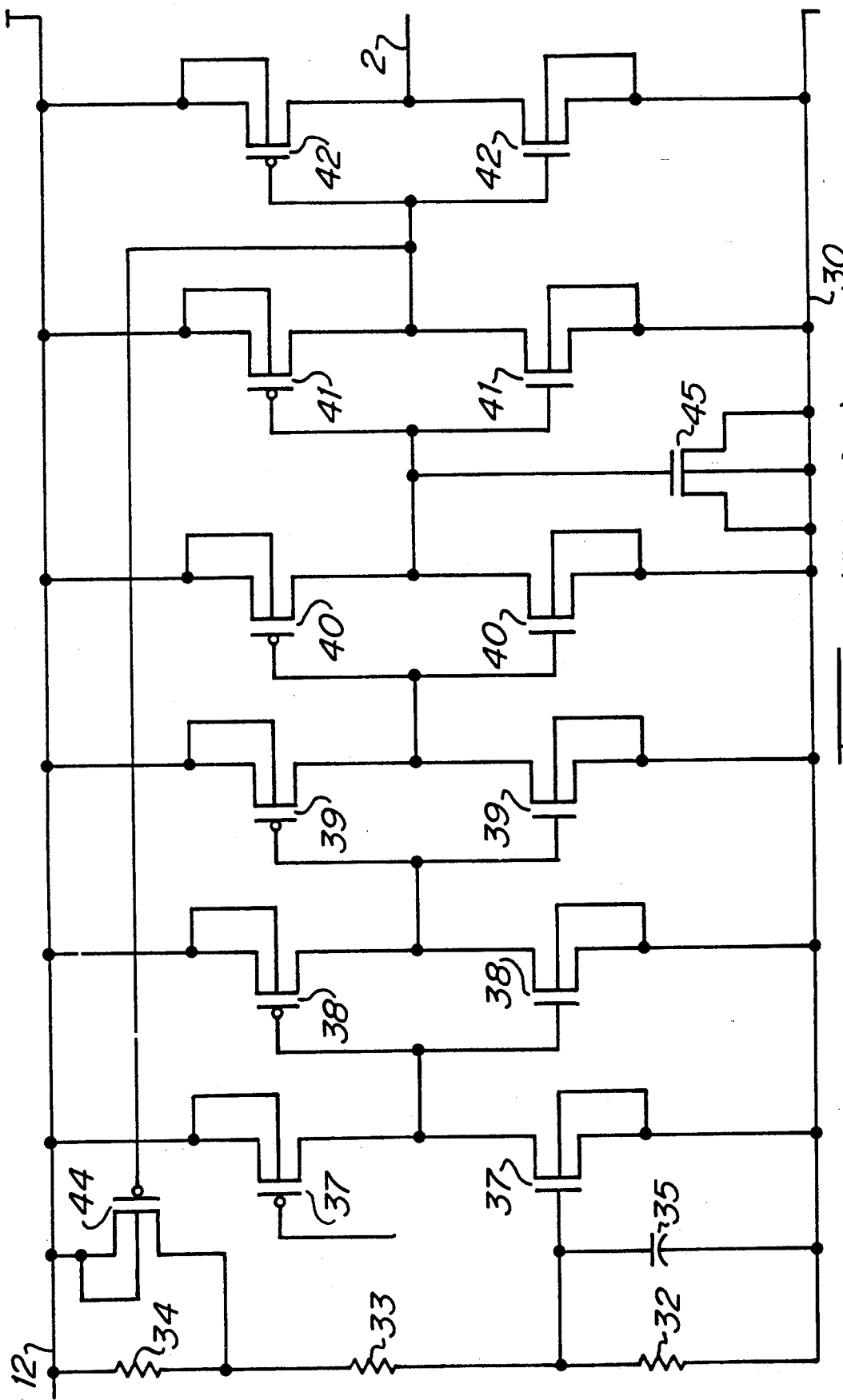

FIG. 2 shows a schematic of power-on-reset circuit 1. Each of a transistor pair 37, a transistor pair 38, a transistor pair 39, a transistor pair 40, a transistor pair 41, and a transistor pair 42 form an inverter chain which provides delay through power-on-reset circuit 1. Power-on-reset circuit 1 also includes a resistor 32, a resistor 33, a capacitor 35, a transistor 44 and a transistor 45 connected as shown. For example, resistor 32 has a resistance of 135 kilohms, resistor 33 has a resistance of 235 kilohms, resistor 34 has a resistance of 120 kilohms, and capacitor 35 has a capacitance of 1.5 picofarads. Transistor 44 is used to raise the voltage on the gate of the n-channel transistor of transistor pair 37 by shunting the resistance of resistor 34. Transistor 45 is used to add capacitance to the output of transistor pair 40, thereby increasing the delay through the inverter chain.

DESCRIPTION OF THE PREFERRED EMBODIMENT

Figure 3:
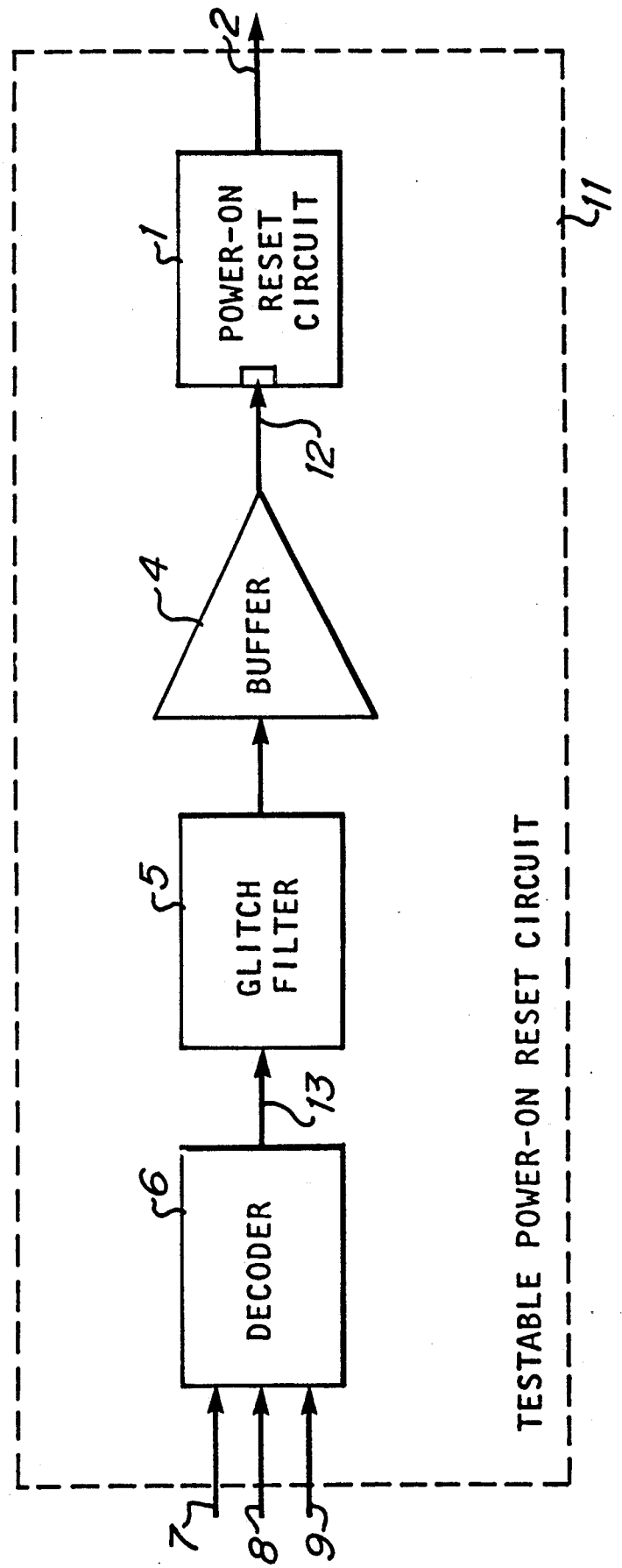
FIG. 3 shows a testable power-on-reset circuit which allows for reset during testing without the disconnection of a power signal in accordance with the preferred embodiment of the present invention.

FIG. 3, shows how a conventional power-on-reset circuit 1 may be configured within a testable power-on-reset circuit 11 in accordance with the preferred embodiment of the present invention.

In order to allow for reset of the electronic device during test, without removing the power signal from a power input pad, a buffer 4 is included in testable power-on-reset circuit 11. Buffer 4 is capable of producing a current sufficient to drive low reset power line 12 of power-on-reset circuit 1. Typically, buffer 4 is capable of driving a load of 10 picofarads in less than 1 nanosecond.

Figure 4:
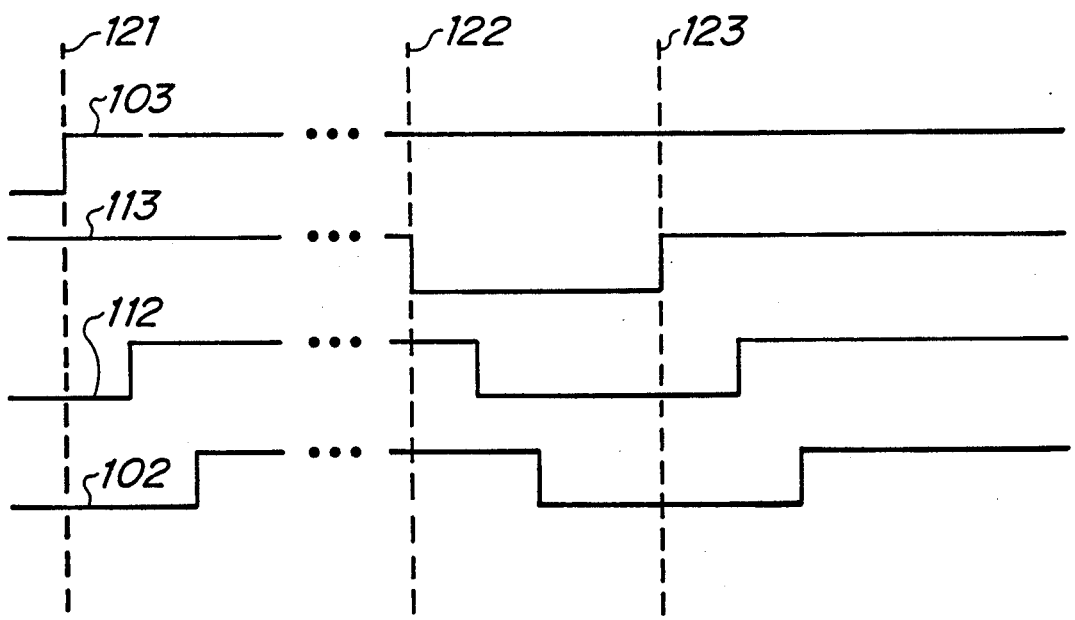
FIG. 4 shows timing diagrams for the testable power-on-reset circuit shown in FIG. 3.

FIG. 4 shows a timing diagram for testable power-on-reset circuit 11 which includes a device power signal 103 representing the power signal placed on the power input pad. The timing diagram also includes a reset power signal 112 placed on reset power line 12 of power-on-reset circuit 1 and a reset signal 102 on reset output 2 of power-on-reset circuit 1.

At a time 121, when power is placed on the power input pad, device power signal 103 is raised high. After a time delay of, for example five nanoseconds, buffer 4 asserts reset power signal 112 high. Once, power signal 112 is high, power-on-reset circuit 1 raises reset signal 102 high after a delay sufficient to allow circuitry on the electronic device to power-up, typically about 200 nanoseconds. During the delay the electronic device performs a reset. The reset of the electronic device typically includes, for example, the placing of all flip-flops of the electronic device into a predetermined state before proceeding with normal operation of the electronic device. Upon reset signal 10 being raised high, the electronic device completes the reset sequence.

During testing, if it is desired to again reset the electronic device, buffer 4 is caused to drive low power signal 112 on reset power line 12 of power-on-reset circuit 1. This in turn causes power-on-reset circuit 1 to drive low reset signal 102 on reset output 2. While reset signal 102 is low, the electronic device performs a reset. In order to complete the reset sequence, buffer 4 is caused to drive high power signal 112 on reset power line 12 of power-on-reset circuit 1. After the propagation delay through power-on-reset circuit 1, reset signal 102 on reset output 2 is driven high and the electronic device completes the reset sequence.

Buffer 4 may be controlled in any number of ways. For example, buffer 4 could be connected to a separate reset pad. A reset signal for test purposes would then be connected, through a dedicated reset pin on the package containing the electronic device, to the separate reset pad.

Alternately, a predetermined combination of signals could trigger a control signal for buffer 4. For example, buffer 4 could be caused to drive low reset power line 12 of power-on-reset circuit 1 when a predetermined illegal input condition is detected on input pads of the electronic device. This illegal condition could include, for example, the simultaneous assertion of both a read input indicating a read is to be performed and a write input indicating a write is to be performed.

For example, a decoder 6, shown in FIG. 3, includes an input 7, an input 8 and an input 9. Inputs 7, 8 and 9 are connected within the electronic device so that decoder 6 is able to detect a predetermined condition which indicates a reset is to be performed. For example, the predetermined condition may be ad predetermined illegal combination of signals on inputs to the electronic device. Once the predetermined condition is detected the reset is performed.

FIG. 4 shows timing for the reset. When the predetermined condition is placed on inputs 7, 8 and 9 of decoder 6, at a time 122, decoder 6 dries low an output signal 113 on output 13. After a delay of, for example, one nanosecond, this results in buffer 4 driving low power signal 112 on reset power line 12 on power-on-reset circuit 1. After an additional delay of, for example, twenty nanoseconds, power-on-reset circuit 1 drives low reset signal 102 on reset output 2. When reset output 2 is driven low, the electronic device performs a reset.

When the predetermined combination of signals is removed from inputs 7, 8 and 9 of decoder 6, decoder 6 drives high output signal 113 on output 13. Buffer 4 then drives high power signal 112 on output line 12 of power-on-reset circuit 1. After a delay, power-on-reset circuit 1 de-asserts reset signal 102 on reset output 2 and the electronic device completes the reset sequence.

A glitch filter 5 may be added between decoder 13 and buffer 4 in order to prevent electrical noise from generating a reset. Glitch filter 5 may be, for example, a low pass filter with a cut-off frequency of greater than 10 megahertz.

I claim:

1. In an electronic device, a testable power-on-reset circuit which allows reset of the electronic device without de-coupling a power signal from the electronic device, the testable power-on-reset circuit comprising:

reset circuitry including a reset power line on which is placed a reset power signal and including a reset output upon which the reset circuitry places a first reset signal value responsive to the reset circuitry initially detecting the reset power signal on the reset power line and upon which the reset circuitry places a second reset signal value responsive to a period of time passing from the reset circuitry initially detecting the reset power signal on the reset power line;

buffer means, having an input and having an output, the output being coupled to the reset power line of the reset circuitry, for providing the reset power signal to the reset power line of the reset circuitry and for removing the reset power signal form the reset power line of the reset circuitry; and, buffer control means, coupled to the input of the buffer means, for, in response to a predetermined condition, causing the buffer means to remove the reset power signal from the reset power line of the reset circuitry.

2. A testable power-on-reset circuit as in claim 1 wherein the buffer control means is a decoder.

3. A testable power-on-reset circuit as in claim 2 wherein the predetermined condition is, in normal operation of the electronic device, an illegal input condition on inputs of the electronic device.

4. A testable power-on-reset circuit as in claim 1, additionally comprising:

a glitch filter coupled between the buffer means and the buffer control means.

5. A testable power-on-reset circuit as in claim 1 wherein the buffer control means, in response to a removal of the predetermined condition, causes the buffer means to restore the reset power signal to the reset power line of the reset circuitry.

6. In an electronic device having reset circuitry, the reset circuitry including a reset power line on which is placed a reset power signal and including a reset output upon which the reset circuitry places a first reset signal value responsive to the reset circuitry initially detecting the reset power signal on the reset power line and upon which the reset circuitry places a second reset signal value responsive to a period of time passing from the reset circuitry initially detecting the reset power signal on the reset power line, a reset test circuit for allowing reset of the electronic device without de-coupling a power signal from the electronic device, the reset test circuit comprising:

buffer means, having an input and having an output, the output being coupled to the reset power line of the reset circuitry, for providing the reset power signal to the reset power line of the reset circuitry and for removing the reset power signal form the reset power line of the reset circuitry; and, buffer control means, coupled to the input of the buffer means, for, in response to a predetermined condition, causing the buffer means to remove the reset power signal from the reset power line of the reset circuitry.

7. A reset test circuit as in claim 6 wherein the buffer control means comprises a decoder.

8. A reset test circuit as in claim 7 wherein the predetermined condition is, in normal operation of the electronic device, an illegal input condition on inputs of the electronic device.

9. A reset test circuit as in claim 6, additionally comprising:

a glitch filter coupled between the buffer means and the buffer control means.

10. A reset test circuit as in claim 6 wherein the buffer control means, in response to a removal of the predetermined condition, causes the buffer means to restore the reset power signal to the reset power line of the reset circuitry.

11. For an electronic device having a power-on-reset circuit, the power-on-reset circuit including a reset power line on which is placed a reset power signal and including a reset output upon which the power-on-reset circuit places a first reset signal value responsive to the power-on-reset circuit initially detecting the reset power signal on the reset power line and upon which the power-on-reset circuit places a second reset signal value responsive to a period of time passing from the power-on-reset circuit initially detecting the reset power signal on the reset power line, a method for performing a reset of the electronic device without de-coupling the power signal from the electronic device, the method comprising the steps of:

(a) placing a predetermined condition on inputs to the electronic device;

(b) in response to the predetermined condition, removing the reset power signal from the reset power line thereby causing the power-on-reset circuit to remove the second reset signal value from the reset output;

(c) removing the predetermined condition from the inputs to the electronic devices; and, (d) in response to the removal of the predetermined condition, restoring the reset power signal to the reset power line.

12. A method as in claim 13 wherein the predetermined condition is, in normal operation of the electronic device, an illegal input condition on the inputs of the electronic device.

13. A method as in claim 11 wherein the electronic device performs a reset in response to the first reset signal value being placed on the reset output and completes the reset when the second reset signal value is placed on the reset output.

* * * * *